United States Patent [19]

Willis

[11] Patent Number: 5,162,910
[45] Date of Patent: Nov. 10, 1992

[54] SYNCHRONIZING CIRCUIT

[75] Inventor: Donald H. Willis, Indianapolis, Ind.

[73] Assignee: Thomson Consumer Electronics, Inc., Indianapolis, Ind.

[21] Appl. No.: 592,393

[22] Filed: Oct. 3, 1990

[51] Int. Cl.[5] .......................... H04N 5/04; H03L 7/00
[52] U.S. Cl. ..................................... 358/158; 370/106; 375/120
[58] Field of Search ....................... 358/148, 150, 158; 375/106, 111, 119, 120; 370/106; 328/63

[56] References Cited

U.S. PATENT DOCUMENTS

| | | | |
|---|---|---|---|
| 4,280,099 | 7/1981 | Rattlingourd | 328/63 |
| 4,360,926 | 11/1982 | Hedin et al. | 375/120 |
| 4,380,742 | 4/1983 | Hart | 331/1 A |
| 4,396,991 | 8/1983 | Baldwin et al. | 364/736 |
| 4,400,664 | 8/1983 | Moore | 324/83 |
| 4,462,110 | 7/1984 | Baldwin et al. | 377/43 |
| 4,466,111 | 8/1984 | Bennett | 375/111 |
| 4,471,299 | 9/1984 | Elmis | 324/83 |
| 4,488,170 | 12/1984 | Nillesen | 358/26 |
| 4,504,799 | 3/1985 | Elmis et al. | 331/1 A |
| 4,636,861 | 1/1987 | Willis | 358/158 |
| 4,639,780 | 1/1987 | Willis | 358/150 |
| 4,680,780 | 7/1987 | Agoston et al. | 375/120 |
| 4,763,342 | 8/1988 | Ambrosio et al. | 377/43 |
| 4,769,704 | 9/1988 | Hirai et al. | 358/148 |
| 4,769,705 | 9/1988 | Lendaro | 358/158 |

FOREIGN PATENT DOCUMENTS 0200348 12/1986 European Pat. Off. .
0266147 10/1986 European Pat. Off. .

OTHER PUBLICATIONS

IBM Technical Disclosure Bulletin, vol. 13, No. 7, 7 Dec. 1970, pp. 1863-1864, "Phase Locked Loop With Delay Line Oscillator", by Laurich et al.

Primary Examiner—Douglas W. Olms
Assistant Examiner—T. Ghebretinsae
Attorney, Agent, or Firm—Joseph S. Tripoli; Joseph J. Laks; Harvey D. Fried

[57] ABSTRACT

A phase locked loop circuit regenerates a synchronizing signal. A first counter counts adjustable and fixed time intervals. A flip/flop generates synchronizing pulses having periods defined by sets of the adjustable and fixed time intervals. A second counter successively measures phase differences between synchronizing pulses and input pulses related to a synchronizing component in a video signal. The phase differences are measured between the ends of the adjustable time intervals in the synchronizing pulses and the input pulses. Each of the phase measurements results in a period correction value for controlling the duration or period of the very next one of the adjustable time intervals. The second counter is reset at the ends of the fixed time intervals. A network defining a loop filter may comprise an accumulator, a first scaler, a summer, and a second scaler for calculating weighted phase difference measurements to define the period correction values. A multiplexer responsive to the synchronizing pulses selects between the period correction values and a constant value as an output value for determining when the first counter is reset.

43 Claims, 6 Drawing Sheets

SYNCHRONIZING CIRCUIT

BACKGROUND OF THE INVENTION

1. Field of the Invention

This invention relates generally to the field of circuits for recovering or regenerating synchronizing signals from video signals, and in particular, to the field of digital horizontal phase locked loop circuits.

2. Description of Related Art

Phase locked loops are used in television receivers for generating a local horizontal synchronizing signal which is synchronous with the horizontal synchronizing component of an incoming video signal. Phase locked loops generally comprise a voltage controlled oscillator for regenerating the synchronizing signal, a phase detector for comparing the phase of the regenerated synchronizing signal with an input signal and generating an error or correction signal, and a low pass filter for developing a control voltage for the oscillator. Phase detectors and oscillators in digital phase locked loops can be implemented by clock driven counters. The filter can be implemented by combinations of latches, accumulators, summing circuits and multipliers. The precision of a digital phase locked loop depends in part upon the resolution of the digital calculations in measuring the phase errors and in controlling the frequency of the oscillator. The resolution in turn is a function of the clock frequency driving the counters and the capacity, if any, of the digital circuitry to perform calculations representative of fractions of the clock period. Generally speaking, the complexity of a digital phase locked loop is a function of the accuracy required in regenerating the synchronizing signal.

Certain applications require high clock frequencies and accuracy within fractions of the clock period. This minimizes jitter due to the higher resolution, in timing or phase, employed for tracking the incoming signal. Other applications may require less accuracy, although minimizing jitter remains an important design criteria. In certain kinds of video displays, for example picture-in-picture, it may not be practical to utilize all of the video information available for the auxiliary or smaller inset picture. There can be too much video information to fit in the smaller area available. In these circumstances, the video information is subsampled. Only one sixteenth of the video information, for example, may be utilized. This means that fewer horizontal lines are utilized and that less information on each line is utilized. The display of such subsampled information can tolerate less accuracy in the regeneration of the horizontal synchronizing signal, and in accordance with an inventive arrangement, a less complex digital synchronizing circuit can be implemented for this circumstance. Even so, jitter must be minimized.

Synchronizing circuits can reconstruct or recover synchronizing signals by generating two time intervals which correspond to two partial periods or pulse parts of a signal. The two partial periods or pulse parts can be combined to form the regenerated signal. Many digital synchronizing systems adjust the duration of each time interval, and consequently each partial period or pulse part, in order to achieve maximum accuracy. This technique requires that two time intervals or partial periods be adjusted responsive to each phase measurement for each period of the reconstructed signal, and consequently, circuitry for processing the phase measurement and adjusting the counter or counters used to implement the oscillator.

A signal which can be very convenient for supplying the clock rate is based on the color subcarrier frequency $f_{SC}$, and in particular, has a frequency of $4 \times f_{SC}$. A time interval of 910 clock pulse periods at $4 \times f_{SC}$, which is approximately 14.3 MHz, corresponds to the nominal period of the horizontal synchronizing component of a conventional video signal in an NTSC system.

SUMMARY OF THE INVENTION

The synchronizing circuit disclosed herein according to various inventive arrangements provides low jitter in a regenerated synchronizing signal of one clock period of time, and operates with an accuracy of one clock period, where the clock rate is conveniently $4 \times f_{SC}$. The synchronizing circuit is especially appropriate for use in recovering the horizontal synchronizing signal in a subsampled video signal, although the circuit is useful in any context where one clock period accuracy is adequate. Moreover, the accuracy can be achieved even where the synchronizing signal of the input video is represented by only a single bit, for example the most significant bit.

In accordance with an inventive arrangement, the horizontal synchronizing signal is regenerated with two partial periods or pulse parts, but only one of the partial periods or pulse parts is adjustable; the other partial period or pulse part is constant. In an NTSC system, for example, the constant partial period or pulse part is set by a time interval of 455 clock periods at $4 \times f_{SC}$. This is the value of one-half of the nominal period of a horizontal synchronizing signal.

In accordance with a further inventive arrangement, phase measurements are undertaken between the input pulse corresponding to the synchronizing component of the video signal and only one partial period or pulse part in each regenerated synchronizing pulse. The trailing edge of the adjustable partial period, for example, can be a phase measurement timing edge.

Each phase measurement results in the calculation of a period correction value for varying the period of the adjustable partial period or pulse part. In accordance with another inventive arrangement, each calculation of a period correction value related to a phase measurement begins after the end of the fixed partial period or pulse part, and concludes by the end of the adjustable partial period or pulse part. Therefore, each period correction value controls the very next one of the adjustable time intervals defining the partial periods or pulse parts. It will be appreciated in this regard that the proper adjustment may very well be the same duration as the preceding partial period, if no period correction is necessary. Although one partial period of each synchronizing pulse is adjustable, it need not necessarily be changed for each successive synchronizing pulse.

A synchronizing circuit according to these and other inventive arrangements is useful in minimizing jitter by minimizing the delay between a phase measurement and the new period of the oscillator resulting from that measurement. The effective delay includes all of the time which is needed for the full effect of a new oscillator period to be seen by, that is processed by, the phase detector. The delay is in each case only one output period of the phase locked loop, which corresponds to one period of the regenerated synchronizing signal.

A synchronizing circuit, according to these and other inventive arrangements, comprises: first means for generating constant and adjustable pulse parts; second means responsive to the first means for developing synchronizing pulses having periods defined by successive sets of the constant and adjustable pulse parts; and third means for generating period correction values for controlling the adjustable pulse parts by measuring phase differences between successive ones of the synchronizing pulses and successive ones of input pulses. Each period correction value is related to each of the phase differences and controls the adjustable pulse parts.

The first means may comprise summing means for determining a difference between the period correction values and a constant value; counting means operable at a clock rate; and, comparing means for generating an output signal for resetting the counting means whenever the counting means has an output value equal to the difference. The second means may comprise bistable means having an output which changes state at the end of each of the constant and adjustable pulse parts. The third means measures phase differences between succesive ones of the adjustable pulse parts in the synchronizing pulses and the input pulses. The third means may comprise an up/down counter, enabled for counting during the input pulses, counting up and down responsive to the level of the synchronizing pulse corresponding to termination of the constant pulse parts.

A low pass filter loop filter for the synchronizing circuit may comprise a network for generating weighted period correction values to compensate more accurately for short term and long term variations in the period of the incoming synchronizing component of the video signal, without increasing the delay in processing each phase measurement. The network may comprise an accumulator for successively adding the phase difference measurements as a running sum, a summer for adding each accumulating running sum to each successive weighted phase difference measurement to define adjusted phase difference measurements, and scaling circuits for weighting relative contributions of the phase difference measurements and the running sum to the adjusted phase difference measurements. The ranges of the accumulated running sum and the period correction values may be limited.

DETAILED DESCRIPTION OF THE PREFERRED EMBODIMENTS

Figure 1:
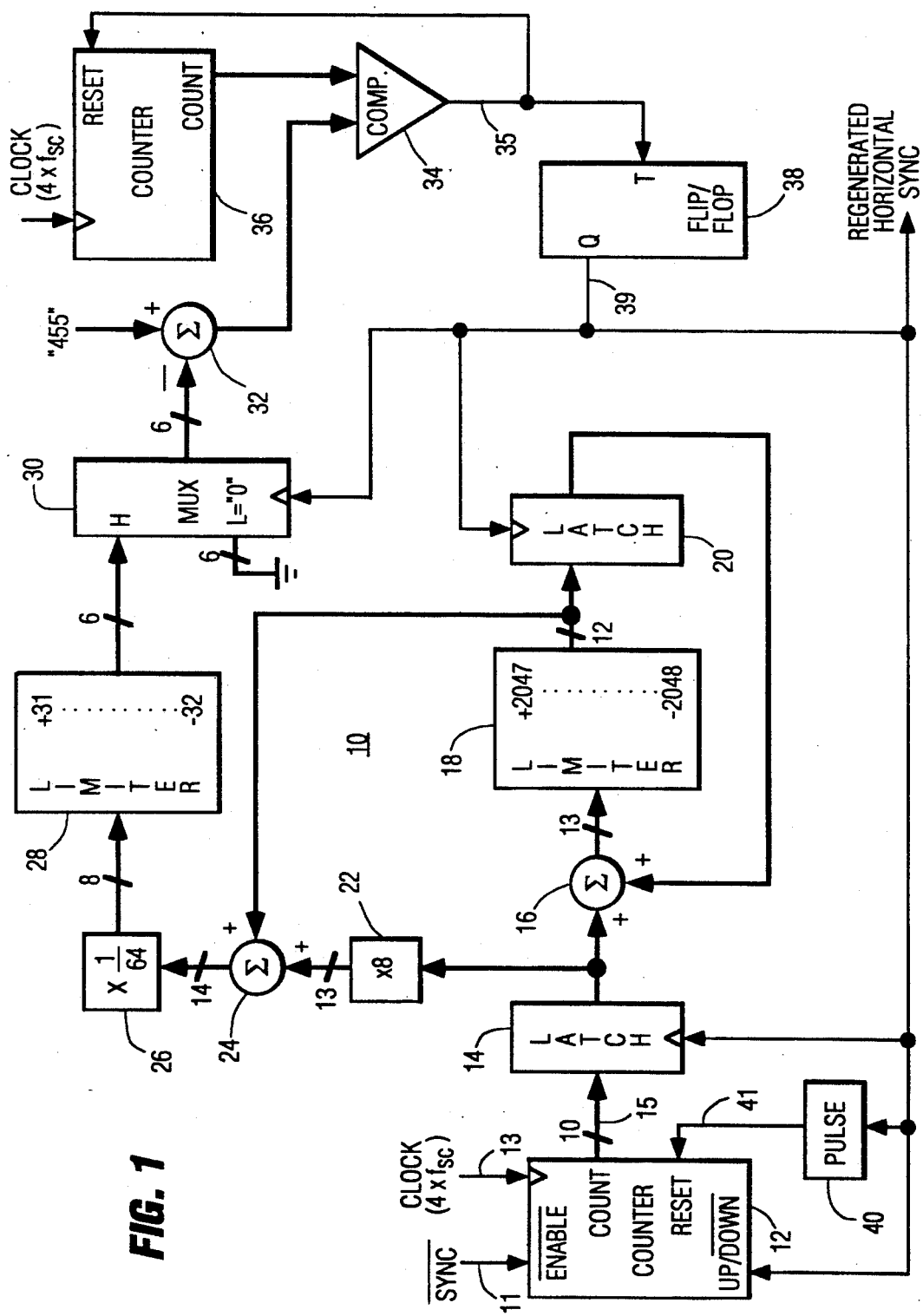
FIG. 1 is a block diagram of a synchronizing circuit according to aspects of this invention, implemented as a digital horizontal phase locked loop.

A synchronizing circuit according to aspects of this invention, and implemented as a digital horizontal phase locked loop 10, is shown in block diagram form in FIG. 1. Circuit 10 comprises digital implementations of the principle constituent elements of a phase locked loop, namely a phase detector, a low pass filter and a voltage controlled oscillator.

The object of the circuit is to regenerate or recover a horizontal synchronizing signal from an input video signal. The regenerated synchronizing signal on line 39 is the Q output of flip/flop 38. The regenerated synchronizing signal is not only an output signal which closes the phase locked loop, but also a control signal for several elements in the circuit. The regenerated synchronizing signal is an input to a pulse generating circuit 40, which generates a reset pulse on line 41, designated in FIG. 2 as PULSE 40. The regenerated synchronizing signal is also a load or set control signal for latches 14 and 20 and an input selection control signal for a multiplexer 30.

Figure 2:
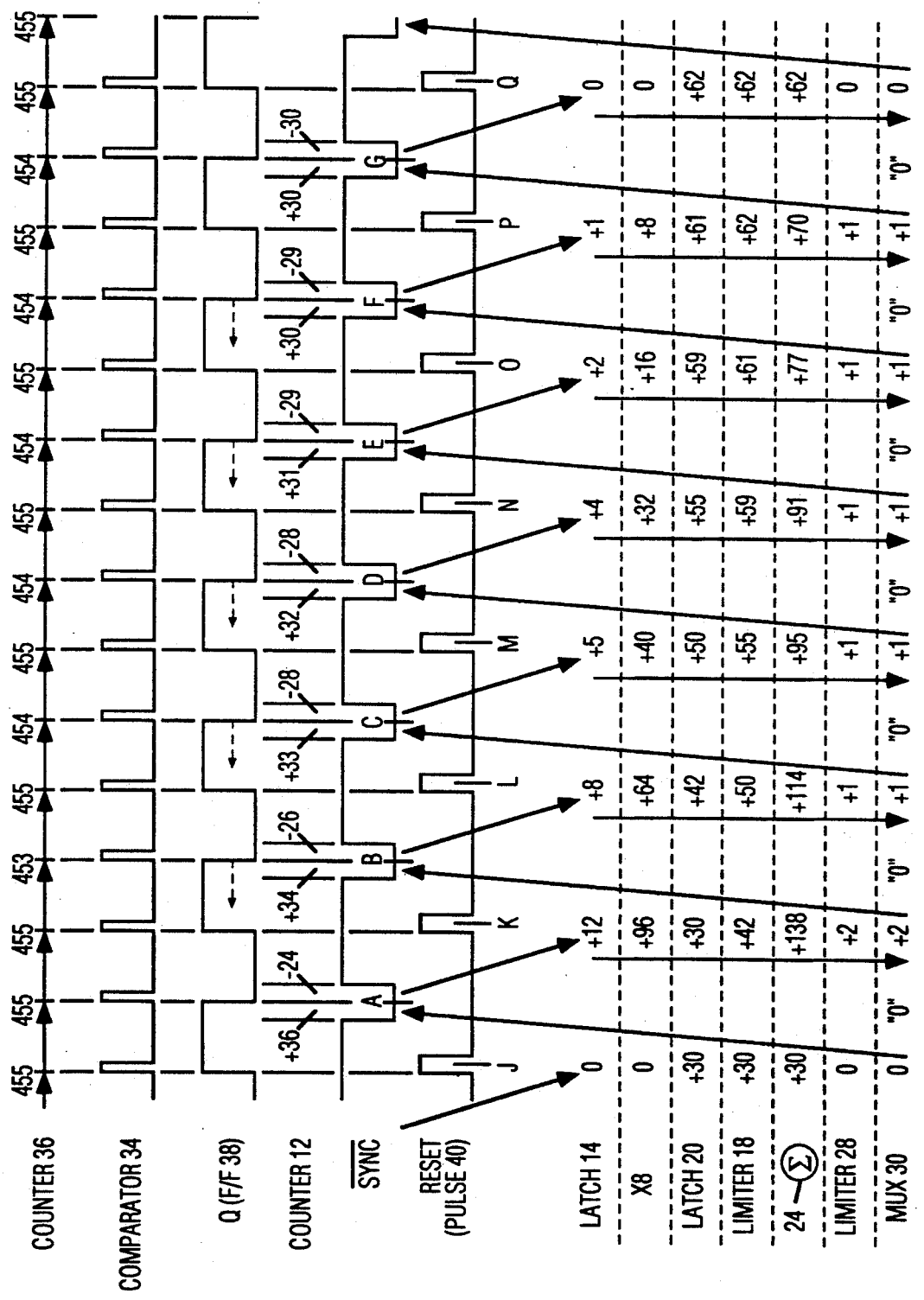
FIG. 2 is a first timing diagram useful for explaining the operation of the phase locked loop circuit shown in FIG. 1, responsive to a step function phase shift of an input signal.

An up/down counter 12 forms a phase detector, which compares the phase of the regenerated synchronizing signal on line 39 to an incoming signal, for example a horizontal synchronizing signal from a video source, on line 11. These signals are shown in FIG. 2 and designated Q(F/F 38) and $\overline{SYNC}$ respectively. The positive to negative transition of Q(F/F 38) is an adjustable timing edge which is expected to occur during the $\overline{SYNC}$ pulse. The counter 12 is enabled for counting during the $\overline{SYNC}$ pulse. When the counter is enabled, the counter counts up if Q(F/F 38) is a logical HI (a logical "1") and counts down if Q(F/F 38) is a logical LO (a logical "0"). Accordingly, the output of the counter is a measure of the relative phase, or position, of the adjustable timing edge within the $\overline{SYNC}$ pulse. Counter 12 counts at a clock rate determined by the clock signal input on line 13. The clock rate is a frequency of $4 \times f_{SC}$ in the illustrated embodiment.

Counter 12 has a gain of two. If the signals are in phase, the up count will equal the down count, and the output will be the net, namely zero. If the phase measurement is off by one clock period, for example with the output waveform lagging the input, the up count will be increased by one and the down count will be decreased by one. The net output will be +2, twice the phase difference. If the phase measurement is off by three clock periods, for example with the output waveform leading the input, the up count will be decreased by three and the down count will be increased by three. The net output will be −6, twice the phase difference.

The output of the counter 12 is an input to latch 14. The count is loaded into latch 14 at each LO to HI transition edge of the regenerated synchronizing signal. The LO to HI transition edge corresponds to the end of the fixed pulse part or time interval. The latch 14 may also be thought of as the input buffer to a network forming the low pass filter. The output of latch 14 is one input to summing circuit 16. The output of summing circuit 16 is an input to a limiter 18, which limits the absolute value of the summing circuit 16 to the values shown. The output of limiter 18 is an input to a latch 20. The output count of limiter 18 is loaded into a latch 20 at the same LO to HI transition edge of the regenerated synchronizing signal. The output of latch 20 is a second input to summing circuit 16. Summing circuit 16, limiter 18 and latch 20 form an accumulator, which keeps a running sum of the raw phase measurements. The range of the running sum is determined by the constraints of limiter 18. This part of the low pass filter network tracks long term changes in frequency of the input pulse, as explained in more detail in connection with FIGS. 3(a)–3(c).

The output of latch 14 is also an input to scaling circuit 22. Scaling circuit 22 multiplies the count in latch 14 by a factor of 8 in the illustrated embodiment. The output of scaling circuit 22 is one input to summing circuit 24. The output of limiter 18, namely the accumulated running sum, or long term deviation factor, is a second input to summing circuit 24. The signal path including scaling circuit 22 tracks transient or short term phase deviations, as will be explained in more detail in connection with FIG. 2. The two factors are combined by addition in summing circuit 24. The transient response is weighted more heavily, by the multiplier factor of 8 in the scaling circuit 22.

It will be appreciated that other arrangements of scaling circuits can achieve the same result. The net effect of scaling circuits 22 and 26 as shown in FIG. 1 on the values in latch 14 is multiplication, namely "8"×"1/64"="⅛". The net effect on the values in limiter 18 is a multiplication by "1/64". As an alternative, for example, assume that scaling circuit 26 is instead placed between the output of limiter 18 and the input of summer 24, and that the output of summer 24 is the input to limiter 28. If the scaling factor of scaling circuit 22 is changed to "⅛", the net effect of the loop filter will be the same. The values in latch 14 are multiplied by "⅛" and the values in limiter 18 are multiplied by "1/64". A number of different arrangements are possible wherein scaling circuits for weighting relative contributions of the phase difference measurements and the running sum to the adjusted phase difference measurements are provided.

The loop filter has a number of advantages. Firstly, the phase locked loop responds more quickly to transient deviations than long term deviations, but due to the effect of the accumulated values in limiter 18, is nevertheless sufficiently immune to noise. Secondly, even if a $\overline{\text{SYNC}}$ pulse is not detected at all, the effect will be no different than a phase measurement of "0". In other words, in the absence of one or more $\overline{\text{SYNC}}$ pulses, the phase locked loop will continue to regenerate the synchronizing signal based upon the long term deviation factor accumulated in limiter 18, which should be close enough until sync detection is reestablished. Thirdly, the relative weighting factor for short and long term tracking can be easily adjusted by changing the factor of scaling circuit 22.

Figure 4:
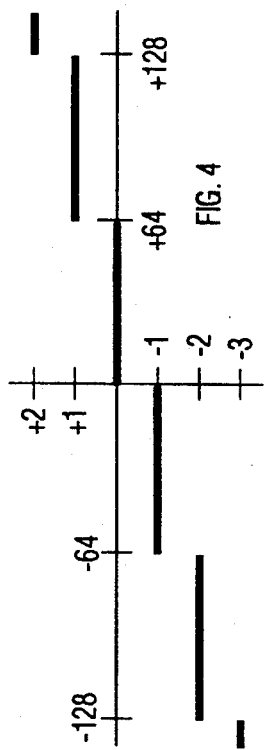
FIG. 4 is a diagram useful for explaining the operation of scaling circuit 26 in FIG. 2.

The output of summing circuit 24 is an input to scaling circuit 26, which multiplies the weighted count by a factor of "1/64". A reduction is necessary in order not to overstate the phase error due to the effects of the accumulator and the scaling circuit 22. The scaling circuit 26 is a divider operating by two's complement binary division. The division is effected by truncating the less significant bits and shifting the remaining bits to define the output value. The output is a discrete amplitude function of whole number inputs and outputs as illustrated in FIG. 4. The size of each step is sixty four counts. If the input value is from "0" to "+63" inclusive, the output is "0". If the input is from "+64" to "+127", the output is "+1". If the input is from "+128" to "+191", the output is "+3", and so on. If the input is from "−1" to "−64" inclusive, the output is "−1". If the input is from "−65" to "−128" inclusive, the output is "−2", and so on. The output function is not symmetric about the axis of the "0" input value. The output of scaling circuit 26 is an input to limiter 28, which limits the range of the weighted correction factor to the values shown. A new value will be established at the output of limiter 28 after the fixed transition edge, but well before the next variable transition edge, to which the correction factor will be applied. The output of limiter 28 is the H input to multiplexer 30.

The fixed and variable pulse parts correspond to fixed and variable time intervals alternately and successively generated by counter 36. Counter 36 operates at the same clock rate or frequency as counter 12, namely $4 \times f_{SC}$. The time interval is a function of the output of multiplexer 30. The output of multiplexer 30 will either be the period correction value then residing in limiter 28 or a predetermined constant value. The constant value is "0" in the illustrated embodiment, wherein the L input of multiplexer 30 is grounded. The period correction value at the H input will be selected as an output when the regenerated synchronizing signal is HI. The "0" value at the L input will be selected as an output when the regenerated synchronizing signal is LO.

The output of multiplexer 30 is one input to summing circuit 32. A second input to summing circuit 32 is the numerical value "455" which corresponds to one-half of the nominal period of the horizontal synchronizing component of an NTSC signal at the $4 \times f_{SC}$ clock rate. The output of the summing circuit 32 is the difference between "455" and the output value of the multiplexer 30. The output value of the multiplexer 30 will alternate between successive period correction values and the constant value "0". The period correction values can be positive, negative or zero. Accordingly, the period correction value will affect one set of every other pulse part or time interval counted by counter 36. This set is the logical HI pulse part. The other set of every other pulse part or time interval will be determined by the constant value "0". This other set is the logical LO pulse part.

Therefore, the constant pulse parts or time intervals determined by the constant value will have a constant duration of "455"−"0"="455" clock periods. The adjustable pulse parts or time intervals determined by the period correction values will have an adjustable duration in the range of "455"−"+31"="424" clock periods to "455"−"−32"="487" clock periods. The range reflects the upper and lower values of limiter 28.

The output of summing circuit 32 is one input to a comparator 34. The output count of counter 36 is the other input to comparator 34. Whenever the output count of counter 36 equals the output value of summing circuit 32, an output pulse is generated by comparator 34 on line 35. The output pulse resets counter 36 and toggles flip/flop 38 at its toggle input T. The output of counter 36 is a signal having twice the frequency of the regenerated synchronizing signal, because counter 36 is reset twice for each complete or full period of the regenerated synchronizing signal. The output Q of flip/flop 38 changes state responsive to each toggle input. The output count of counter 36 and the output of comparator 34 are shown in FIG. 2.

Figure 3A:
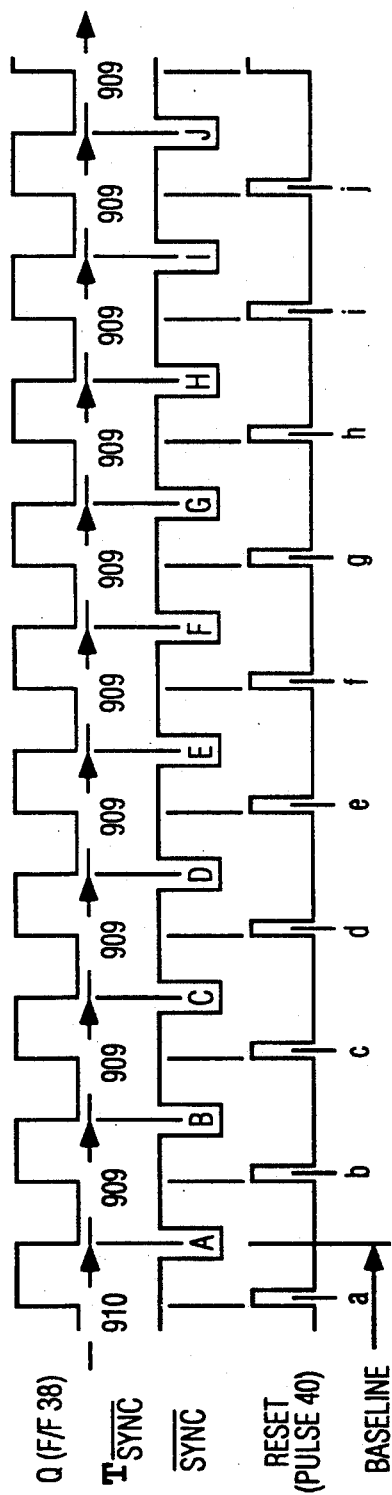
FIGS. 3(a), 3(b) and 3(c) are a second and composite timing diagram useful for explaining the operation of the phase locked loop circuit shown in FIG. 1, responsive to a frequency change of an input signal.
Figure 3B:
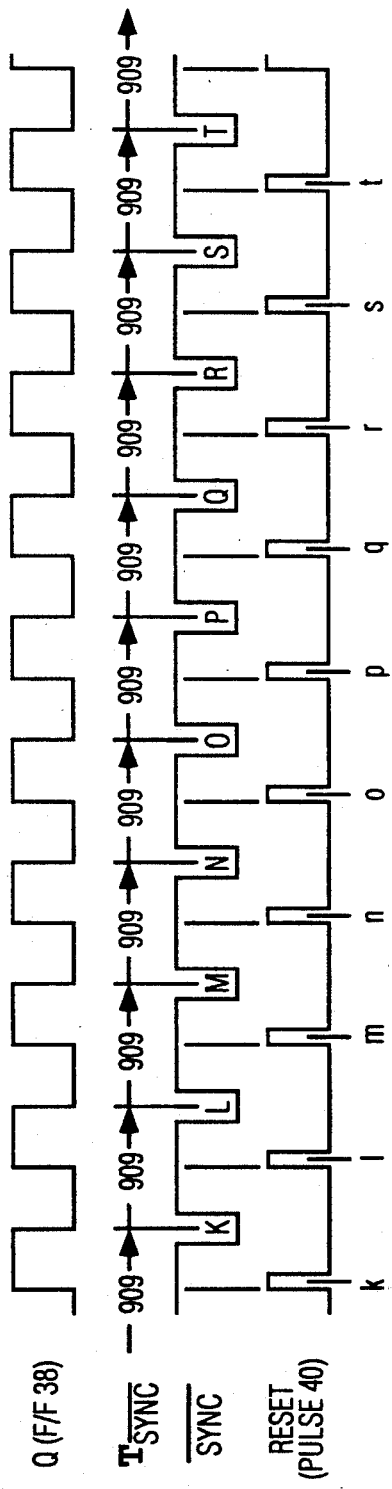
Figure 3C:
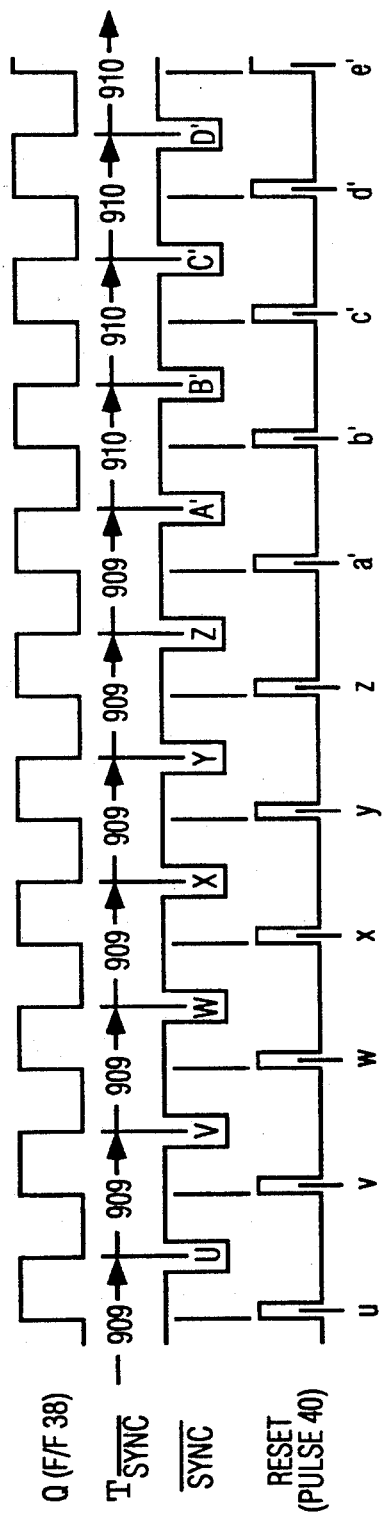

The operation of the circuit in FIG. 1 responsive to a step function change in phase of the input $\overline{\text{SYNC}}$ signal can be appreciated by following the propagation of values illustrated in FIG. 2. It is assumed that the frequency of the $\overline{\text{SYNC}}$ signal remains constant. Certain initial values for the latch 20 and limiter 18 are also assumed, in order to reduce the number of iterations needed to reestablish a synchronized condition. Pulse J of the reset pulses, generated by pulse circuit 40 responsive to the rising edges of the output waveform, resets up/down counter 12. The actual width of each reset pulse corresponds to one clock pulse of the 4×$f_{SC}$ clock rate signal. This is so narrow in terms of the scale of FIGS. 2 and 3(a)-3(c) that the pulse width of the reset pulses is not drawn to scale. The same rising edge of the output waveform sets latches 14 and 20, and selects the H or L output of multiplexer 30. The output waveform Q(F/F 38) is assumed to be synchronized with the input signal at the time of reset pulse J. The output of counter 12 is assumed to have been "0" for several preceding input $\overline{SYNC}$ pulses. Accordingly, latch 14 contains "0". Latches 20 and limiter 18 are assumed to each have "+30" stored therein, for purposes of simplifying the example. The choice is arbitrary, and could be "0" as shown in FIGS. 3(a)-3(c). The result would be a much longer example, as in FIGS. 3(a)-3(c). These starting values are indicated in a column of numbers directly below reset pulse J on FIG. 2. This indicates that the regenerated synchronizing signal is in phase with the $\overline{SYNC}$ pulses, neither leading nor lagging.

Strictly speaking, each phase measurement begins after termination of a reset pulse from pulse circuit 40 and continues until the next reset pulse, which coincides with the output of counter 12 being loaded into latch 14. The counter 12 can be enabled by noise, as well as genuine $\overline{SYNC}$ pulses. However, for purposes of illustration, it is assumed that the counter will only be enabled for up/down counting during the occurrence of the $\overline{SYNC}$ pulses. It is also assumed for purposes of this example that the nominal width of each $\overline{SYNC}$ pulse is 60 clock periods at 4×$f_{SC}$. It must be remembered, however, that the circuit is accurate only to within one clock period. Accordingly, it can be expected that the total of the up and down counts will not always equal 60 clock periods, but might be 59 or 61 clock periods. This variation is included in the example of FIG. 2, but not in the example of FIGS. 3(a)-3(c). When noise is taken into consideration, the total can be other than the nominal values. In fact, if a $\overline{SYNC}$ pulse is not detected, the output of counter 12 will reflect only noise.

The first phase measurement in the example of FIG. 2 occurs at $\overline{SYNC}$ pulse A. While the counter is enabled, the counter counts up (+) "36" and down (−) "24". The output of up/down counter at the termination of $\overline{SYNC}$ pulse A is "+12". This indicates that the $\overline{SYNC}$ signal has undergone a phase change of six clock periods. The regenerated synchronizing signal now lags the $\overline{SYNC}$ pulse in phase by the six clock periods. While this phase measurement is taking place, the Q(F/F 38) goes LO, selecting the "0" output of the multiplexer. The difference calculated by summing circuit 32 is "455", which fixes the duration of the next fixed time interval and pulse part. Reset pulse K resets up/down counter 12, and the output waveform loads "+12" into latch 14 and loads "+30", the contents of limiter 18, into latch 20. The new value in limiter 18 then becomes "+42", the value in latch 20, namely "+30", added to the output of latch 14, namely "+12". The output of scaling circuit 22 is "8"×"+12"="+96". The output of summing circuit 24 is "+96"+"+42"="+138". The output of scaling circuit 26 is "+138"×"1/64"="+2", in accordance with the twos complement nature of the digital calculation, as explained above. Counter 36 has been counting during the time these calculations are being processed. The regenerated synchronizing signal is a logical H1, so that "+2" from the H input is the output of multiplexer 30. The output of summing circuit 32 is "455"−"+2"="453".

Accordingly, the next adjustable time interval and pulse part is "453" clock periods.

The very next adjustable time interval or pulse part is therefore two clock periods shorter than he nominal value, causing the phase measurement edge, which occurs during the next $\overline{SYNC}$ pulse, B, to move to the left as shown by the arrow, so as to reduce the phase lag.

The next time interval or pulse part, which begins during $\overline{SYNC}$ pulse B, is fixed at "455" clock periods, by the L input selection of multiplexer 30.

The next phase measurement during $\overline{SYNC}$ pulse B indicates that the phase lag has decreased, due to the correction based on the previous measurement during $\overline{SYNC}$ pulse A. The output of up/down counter 12 is "+8". At the time of reset pulse L, latch 14 is loaded with "+8". Latch 20 is loaded with "+42", the previous value in limiter 18, by the output waveform. Limiter 18 has the output of summing circuit 16, which is the sum of the current value in latch 14 and the value in latch 20, namely "+42"+"+8"="+50". The output of scaling circuit 22 is "+64". The output of summing circuit 24 is "+64"+"+50"="+114". The output of scaling circuit 26 is "+114"×"1/64"="+1". The H output of multiplexer 30 is "+1". The output of the summing circuit 32 is "455"−"+1"="454". The adjustable time interval or pulse part is one clock period shorter than the nominal value, causing the adjustable timing edge, which occurs during the next $\overline{SYNC}$ pulse C, to move to the left as shown by the arrow, so as to reduce the phase lag.

The next time interval or pulse part, which begins during pulse C, is fixed at "455" clock periods, by the L input selection of multiplexer 30.

The next phase measurement during $\overline{SYNC}$ pulse C indicates that the phase measurement has decreased to "+5", an improvement of three clock counts. Two counts of improvement result from the correction from measurement B. The other count of improvement results from the synchronizing pulse not having a duration of an integer number of clock periods. Accordingly, the total count was 61 rather than 60. The deviation from the nominal total count of 60 proved favorable. The output of up/down counter 12 is "+5". Counter 12 is reset by pulse L. Latch 14 is loaded with "+5" and latch 20 is loaded with "+50", the previous value in limiter 18, by the output waveform. Limiter 18 has the output of summing circuit 16, which is the sum of the current value in latch 14 and the value in latch 20, namely "+5"+"+50"="+55". The output of scaling circuit 22 is "+40". The output of summing circuit 24 is "+40"+"+55"="+95". The output of scaling circuit 26 is "+95"×"1/64"="+1". The H output of multiplexer 30 is "+1". The output of the summing circuit 32 is "455"−"+1"="454". The adjustable time interval or pulse part is one clock period shorter than the nominal value, causing the phase measurement edge of the adjustable pulse part, which occurs during $\overline{SYNC}$ pulse D, to move further to the left as shown by the arrow, so as to reduce the phase lag even more.

The next time interval or pulse part, which begins during pulse D, is fixed at "455" clock periods, by the L input selection of multiplexer 30.

The next phase measurement during $\overline{SYNC}$ pulse D indicates that the phase lag has decreased, due to the correction based on the previous measurement. The output of up/down counter 12 is "+4". Counter 12 is reset by pulse L. Latch 14 is loaded with "+4" and latch 20 is loaded with "+55", the previous value in limiter 18, by the output waveform. Limiter 18 has the output of summing circuit 16, which is the sum of the current value in latch 14 and the value in latch 20, namely "+4"+"+55"="+59". The output of scaling circuit 22 is "+32". The output of summing circuit 24 is "+32"+"+59"="+91". The output of scaling circuit 26 is "+91"×"1/64"="+1". The H output of multiplexer 30 is "+1". The output of the summing circuit 32 is "455"−"+1"="454". The next adjustable time interval or pulse part is one clock period shorter than the nominal value, causing the measurement edge, which occurs during the next $\overline{\text{SYNC}}$ pulse E to move to the left.

The next time interval or pulse part, which begins during pulse E, is fixed at "455" clock periods, by the L input selection of multiplexer 30.

The next phase measurement during $\overline{\text{SYNC}}$ pulse E indicates that the phase lag has decreased, due to the correction based on the previous measurement. The output of up/down counter 12 is "+2". Counter 12 is reset by pulse L. Latch 14 is loaded with "+2" and latch 20 is loaded with "+59", the previous value in limiter 18, by the output waveform. Limiter 18 has the output of summing circuit 16, which is the sum of the current value in latch 14 and the value in latch 20, namely "+2"+"+59"="+61". The output of scaling circuit 22 is "+16". The output of summing circuit 24 is "+16"+"+61"="+77". The output of scaling circuit 26 is "+77×"1/64"="+1". The H output of multiplexer 30 is "+1". The output of the summing circuit 32 is "455"−"+1"="454". The next adjustable time interval or pulse part is one clock period shorter than the nominal value, causing the measurement edge, which occurs during the next $\overline{\text{SYNC}}$ pulse F to move to the left.

The next time interval or pulse part, which begins during pulse F, is fixed at "455" clock periods, by the L input selection of multiplexer 30.

The next phase measurement during $\overline{\text{SYNC}}$ pulse F indicates that the phase lag has decreased, due to the correction based on the previous measurement. The output of up/down counter 12 is "+1" due to a shorter counting interval of 59 clock periods. Counter 12 is reset by pulse L. Latch 14 is loaded with "+1" and latch 20 is loaded with "+61", the previous value in limiter 18, by the output waveform. Limiter 18 has the output of summing circuit 16, which is the sum of the current value in latch 14 and the value in latch 20, namely "+1"+"+61"="+62". The output of scaling circuit 22 is "+8". The output of summing circuit 24 is "+8"+"+62"="+70". The output of scaling circuit 26 is "+70"×"1/64"="+1". The H output of multiplexer 30 is "+1". The output of the summing circuit 32 is "455"−"+1"="454". The next adjustable time interval or pulse part is one clock period shorter than the nominal value, causing the measurement edge, which occurs during the next $\overline{\text{SYNC}}$ pulse G to move to the left.

The next time interval or pulse part, which begins during pulse G, is fixed at "455" clock periods, by the L input selection of multiplexer 30.

The next phase measurement during $\overline{\text{SYNC}}$ pulse G indicates that the phase error has finally been eliminated, due to the correction based on the previous measurement. The output of up/down counter 12 is "0". Counter 12 is reset by pulse Q. Latch 14 is loaded with "0" and latch 20 is loaded with "+62", the previous value in limiter 18, by the output waveform. Limiter 18 has the output of summing circuit 16, which is the sum of the current value in latch 14 and the value in latch 20, namely "0"+"+62"="+62". The output of scaling circuit 22 is "0". The output of summing circuit 24 is "0"+"+62"="+62". The output of scaling circuit 26 is "+62"×"1/64"="0". The H output of multiplexer 30 is "0". The output of the summing circuit 32 is "455"−"0"="455". The next adjustable time interval or pulse part is the nominal value, causing the measurement edge, which occurs during the next $\overline{\text{SYNC}}$ pulse (not shown) to remain in phase.

The operation of the circuit in FIG. 1 responsive to a change in frequency of the input $\overline{\text{SYNC}}$ signal can be appreciated by following the propagation of values illustrated in FIGS. 3(a)–3(c). It is assumed that the frequency of the $\overline{\text{SYNC}}$ signal suddenly increases slightly, so that the period $T_{\overline{\text{SYNC}}}$ decreases from the nominal value of 910 clock periods, to 909 clock periods, at 4×$f_{SC}$. It is also assumed that each $\overline{\text{SYNC}}$ pulse will have a uniform width of 60 clock periods. With reference to FIG. 3(a), the regenerated synchronizing signal is in phase with the input $\overline{\text{SYNC}}$ signal at the time of reset pulse a indicated by the "0"s in the column under reset pulse a. No correction is made to the phase measurement edge during $\overline{\text{SYNC}}$ pulse A, which is defined as a baseline timing mark for this example. The baseline is indicative of a hypothetical timing signal which remains constant at the nominal frequency, corresponding to a period $T_{\overline{\text{SYNC}}}$ of 910 clock periods. The phase measurements in the $\overline{\text{SYNC}}$ PHASE row of numbers and the Q(F/F 38) PHASE row of numbers which appear in FIGS. 3(a)–(c) are relative to this hypothetical signal. The difference between the phase measurements of the $\overline{\text{SYNC}}$ and Q(F/F 38) signals at any given time represents the phase of the $\overline{\text{SYNC}}$ and Q(F/F 38) signals relative to one another. Use of such a baseline signal facilitates the following explanation.

Beginning at $\overline{\text{SYNC}}$ pulse A, the frequency of the $\overline{\text{SYNC}}$ signal increases, to the extent that the period decreases by one clock period. This causes the $\overline{\text{SYNC}}$ signal to begin leading the output waveform Q(F/F 38). With respect to the baseline signal, each successive $\overline{\text{SYNC}}$ pulse results in the $\overline{\text{SYNC}}$ signal leading by one additional clock period. This is indicated by the $\overline{\text{SYNC}}$ PHASE row of values in FIGS. 3(a)–(c). The phase of the output waveform relative to the baseline signal is shown by the row of values designated Q(F/F 38) PHASE. In this example, operation of the phase locked loop must cause the output waveform to catch up with the input signal, and thereafter maintain synchronization at the higher frequency. The signals will be back in phase with one another when each has the same phase relative to the baseline signal.

The generation of each period correction value is the same as in FIG. 2, and accordingly, each of the iterations needed to reestablish synchronization is not described in detail. The $\overline{\text{SYNC}}$ signal leads the baseline by four clock periods by the time of reset pulse e. The phase measurement at $\overline{\text{SYNC}}$ pulse E results in the first period correction value other than "0". After reset pulse f, the $\overline{\text{SYNC}}$ pulse leads the baseline by five clock periods and the output waveform leads the baseline by one clock period. The phase error has now reached its maximum, and remains at that level through $\overline{\text{SYNC}}$ pulse K in FIG. 3(b), due to the value which has accumulated in limiter 18.

The phase measurement at $\overline{\text{SYNC}}$ pulse K results in a period correction value of "+2", due to a higher value which has accumulated in limiter 18. The phase measurement at $\overline{\text{SYNC}}$ pulse L shows that the $\overline{\text{SYNC}}$ signal leads the baseline by eleven clock periods and the output waveform leads the baseline by eight clock periods. The phase error has now been reduced to three clock periods. The phase measurement at $\overline{\text{SYNC}}$ pulse M results in a period correction value of "+2", which reduces the phase error measured at $\overline{\text{SYNC}}$ pulse N to two clock periods. The period correction values of "+2" become more frequent as the value in limiter 18 increases, even though the phase error decreases, which decreases the transient path contribution to summing circuit 24.

The phase measurement at $\overline{\text{SYNC}}$ pulse Q results in a period correction value of "+2". At $\overline{\text{SYNC}}$ pulse R, the $\overline{\text{SYNC}}$ signal leads the baseline by seventeen clock periods and the output waveform leads the baseline by sixteen clock periods. The phase error is reduced to only one clock period. This phase error continues through $\overline{\text{SYNC}}$ pulse Y in FIG. 3(c).

The phase measurement at $\overline{\text{SYNC}}$ pulse Y results in a period correction value of "+2". At $\overline{\text{SYNC}}$ pulse Z, the output waveform is perfectly synchronized with the input $\overline{\text{SYNC}}$ signal, as each leads the baseline by twenty five clock periods. The phase measurement at $\overline{\text{SYNC}}$ pulse Z results in a phase error of zero clock periods. The transient path makes no contribution to summing circuit 24. However, the value accumulated in limiter 18 is now large enough to result in a period correction value of "+1", even though the measured phase error is zero. Accordingly, the signals are still in phase at $\overline{\text{SYNC}}$ pulse A', each leading the baseline by twenty six clock periods. The value accumulated in limiter 18 is therefore effective for tracking long term frequency deviations in the input signal.

The actual number of iterations need to reestablish synchronization after step function changes or frequency changes, or combinations thereof, of the input signal will depend upon the extent and nature of the deviation as well as the value accumulated in limiter 18.

The phase measurement by up/down counter 12 can be a negative number, indicating that the regenerated synchronizing signal is leading the $\overline{\text{SYNC}}$ pulses in phase. Negative numbers propagating through to limiter 28 and multiplexer 30 will increase the adjustable time interval or pulse part. If the period correction value is "−2", for example, the output of summing circuit 32 will be "455"−"−2"="457". The adjustable time interval or pulse part will be two clock periods longer than nominal. This causes the phase measurement edge, that is the trailing edge of the adjustable partial period or pulse part, to move to the right relative to the baseline signal, in the sense of FIGS. 3(a)–3(c).

The frequency of the incoming signal changes back to the nominal frequency, corresponding to a period $T_{\overline{\text{SYNC}}}$ of 910 clock periods, at $\overline{\text{SYNC}}$ pulse B'. The phase locked loop makes the phase error larger, based on the previous measurement and the value in limiter 18. The difference is one clock period, and the phase error measurement is "−2". Eventually, synchronization will be reestablished as the value accumulated in limiter 18 decreases and the adjustable pulse parts are made longer than 455 clock periods.

Figure 5:
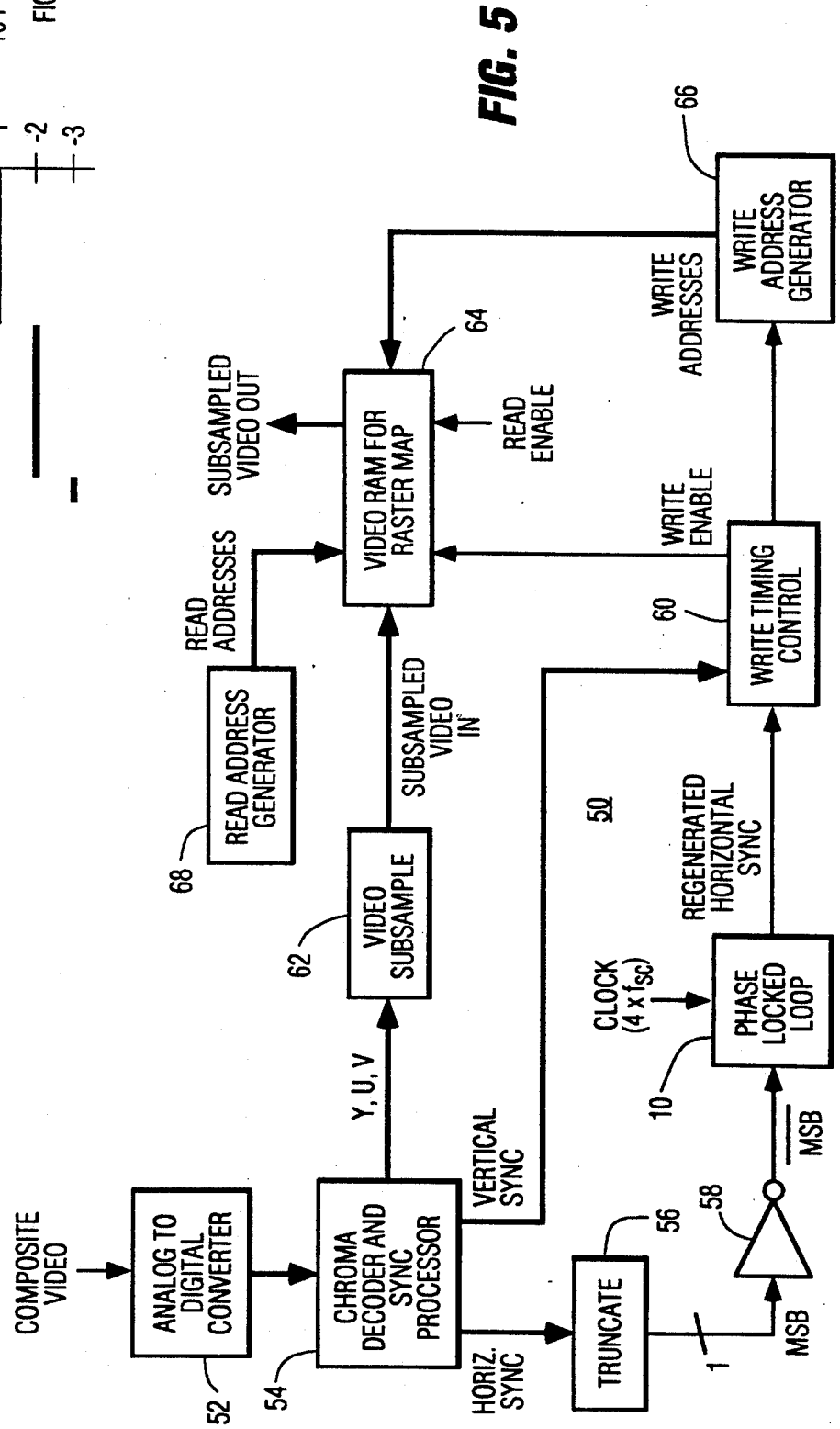
FIG. 5 is a block diagram of a video processing circuit including the synchronizing circuit shown in FIG. 1.

A video processing circuit 50 incorporating the synchronizing circuit 10 is shown in block diagram form in FIG. 5. A composite video signal is converted to digital format by analog to digital converter 52. The video signal may be intended as the source for an auxiliary display as a smaller inset picture in a multiple picture display, for example as a picture-in-picture. The synchronizing signals and video signal are separated from one another by chroma and sync processor 54. The video information, in Y, U, V format, for example, is subsampled by circuit 62 for storage in a video ram 64, where a raster map for each field or frame of the auxiliary picture is successively stored prior to display with a main signal. The video ram is controlled by a number of signals. Write addresses are provided by a write address generator 66. Read addresses are provided by a read address generator 68. The other control signals are read and write enable signals.

The horizontal synchronizing signal may be truncated by circuit 56 to its most significant bit (MSB), although this is not necessary in all applications. The most significant bit may need to be inverted by inverter 58 to be the proper polarity for the $\overline{\text{ENABLE}}$ input of an up/down counter. The $\overline{\text{MSB}}$ is one of two inputs to phase locked loop circuit 10. The $4 \times f_{SC}$ clock is the other input. The regenerated horizontal synchronizing signal, which is phase locked to the horizontal synchronizing signal of the auxiliary video signal, is an input to a write timing control circuit 60. The vertical sync output of the chroma and sync processor 54 is another input to the write timing control circuit 60. The write timing control 60 generates the write enable signal and a timing control signal for the write address generator 66. The write enable signals are properly timed with the subsampled video, and the write address generator generates the correct addresses, so that the video subsamples are always stored in the proper location in the raster map defined in the video ram 64. Read enable signals and read address signals control reading out the raster mapped video subsamples synchronously with the main picture display.

The phase locked loop circuit 10 according to aspects of this invention has a bandwidth appropriate for tracking an input synchronizing signal fast enough, while at the same time exhibiting good noise immunity. The accuracy of the phase locked loop circuit 10 can thus minimize jitter, if any, at the border of the main picture and the auxiliary picture.

What is claimed is:

1. A synchronizing circuit, comprising:
   first means for generating fixed and adjustable time intervals;
   second means responsive to said first means for developing a signal of synchronizing pulses, said pulses having successive periods defined by successive sets of said fixed and adjustable time intervals; and,
   third means for generating period correction values for controlling said adjustable time intervals by measuring phase differences between successive ones of said synchronizing pulses and successive ones of input pulses.

2. The circuit of claim 1, wherein said first means comprises counting means.

3. The circuit of claim 1, wherein said second means comprises bistable means having an output which changes state at the end of each of said fixed and adjustable time intervals.

4. The circuit of claim 1, wherein said third means measures said phase differences between successive ones of said adjustable time intervals in said synchronizing pulses and said input pulses.

5. The circuit of claim 4, wherein each said period correction value related to each said phase difference controls the next successive one of said adjustable time intervals.

6. The circuit of claim 1, wherein each said period correction value related to each said phase difference controls the next successive one of said adjustable time intervals.

7. The circuit of claim 1, further comprising multiplexing means responsive to said synchronizing pulses for supplying as an output to said first means a predetermined value alternately with each of said period correction values.

8. The circuit of claim 1, wherein said first means comprises:
   summing means for determining a difference between said period correction values and a constant value;
   counting means operable at a clock rate; and,
   comparing means for generating an output signal for resetting said counting means whenever said counting means has an output value equal to said difference.

9. The circuit of claim 1, further comprising low pass filtering means for weighting said period correction values.

10. The circuit of claim 1, further comprising:
    accumulating means for successively adding said phase difference measurements as a running sum;
    means for adding each said accumulating running sum to each said successive phase difference measurement to define adjusted phase difference measurements; and,
    means for weighting relative contributions of said phase difference measurements and said running sum to said adjusted phase difference measurements.

11. The circuit of claim 10, further comprising means for limiting the value of said accumulating running sum.

12. The circuit of claim 10, further comprising means for limiting the value of said period correction values.

13. The circuit of claim 1, wherein said third means comprises an up/down counter, enabled for counting during said input pulses, counting up and down responsive to the level of said synchronizing pulses and reset at the end of said fixed time intervals.

14. A synchronizing circuit, comprising:
    first means for regenerating a signal of synchronizing pulses, said signal having successive periods defined by an adjustable partial period, terminated by a phase measurement edge, and a fixed partial period;
    second means for generating period correction values for varying said adjustable partial periods by measuring phase differences between successive ones of said phase measurement edges and successive ones of input pulses; and,
    third means responsive to said period correction values and responsive to a predetermined value for generating said adjustable and fixed partial periods.

15. The circuit of claim 14, wherein said first means comprises bistable means having an output which changes state at the end of each of said fixed and adjustable partial periods.

16. The circuit of claim 14, wherein each said period correction value related to each said phase difference controls the next successive one of said adjustable partial periods.

17. The circuit of claim 14, further comprising multiplexing means responsive to said synchronizing pulses for supplying as an output to said third means a predetermined value alternately with each of said period correction values.

18. The circuit of claim 14, wherein said third means comprises:
    summing means for determining a difference between said period correction values and a constant value;
    counting means operable at a clock rate; and,
    comparing means for generating an output signal for resetting said counting means whenever said counting means has an output value equal to said difference.

19. The circuit of claim 14, further comprising low pass filtering means for weighting said period correction values.

20. The circuit of claim 14, further comprising:
    accumulating means for successively adding said phase difference measurements as a running sum;
    means for adding each said accumulating running sum to each said successive phase difference measurement to define adjusted phase difference measurements; and,
    scaling means for weighting relative contributions of said phase difference measurements and said running sum to said adjusted phase difference measurements.

21. The circuit of claim 20, further comprising means for limiting the value of said accumulating running sum.

22. The circuit of claim 20, further comprising means for limiting the value of said period correction values.

23. The circuit of claim 14, wherein said second means comprises an up/down counter, enabled for counting during said input pulses, counting up and down responsive to the level of said synchronizing pulses and reset at the end of said fixed partial periods.

24. A phase locked loop circuit for regenerating a synchronizing signal, comprising:
    first counting means for counting adjustable and fixed time intervals;
    bistable means responsive to said first counting means for generating synchronizing pulses having periods defined by sets of said adjustable and fixed time intervals;
    second counting means for generating period correction values by measuring phase differences between successive ones of said synchronizing pulses and successive ones of input pulses; and,
    multiplexing means responsive to said synchronizing pulses for selecting between said period correction values and a predetermined value as an output value for determining when said first counting means is reset.

25. The circuit of claim 24, wherein said second counting means measures phase differences between successive ones of said adjustable time intervals in said synchronizing pulses and said input pulses.

26. The circuit of claim 25, wherein each said period correction value controls the next successive one of said adjustable time intervals.

27. The circuit of claim 24, wherein each said period correction value controls the next successive one of said adjustable time intervals.

28. The circuit of claim 24, wherein said first counting means comprises:

summing means for determining a difference between each said said output value of said multiplexing means and a constant value;

a counter operable at a clock rate; and, comparing means for generating an output signal for resetting said counter whenever said counter has an output value equal to said difference.

29. The circuit of claim 24, wherein a trailing edge of each of said adjustable time intervals defines a timing edge.

30. The circuit of claim 29, wherein said phase difference measurements are made relative to said timing edges.

31. The circuit of claim 30, wherein each of said phase difference measurements determines the position of said timing edge in the next succeeding one of said synchronizing pulses.

32. The circuit of claim 24, further comprising low pass filtering means for weighting said period correction values.

33. The circuit of claim 24, further comprising:

accumulating means for successively adding said phase difference measurements as a running sum;

means for adding each said accumulating running sum to each said successive phase difference measurement to define adjusted phase difference measurements; and, scaling means for weighting relative contributions of said phase difference measurements and said running sum to said adjusted phase difference measurements.

34. The circuit of claim 33, further comprising means for limiting the value of said accumulating running sum.

35. The circuit of claim 33, further comprising means for limiting the value of said period correction values.

36. The circuit of claim 24, wherein said second counting means comprises an up/down counter, enabled for counting during said input pulses, counting up and down responsive to the level of said synchronizing pulses and reset at the end of said fixed time intervals.

37. A digital phase locked loop circuit for regenerating a synchronizing signal, comprising:

counting means for generating a timing signal having a first frequency by counting successive time intervals;

means for dividing said timing signal to generate a synchronizing signal having a second frequency less than said first frequency;

means for resetting said counting means and for clocking said dividing means at the ends of said time intervals, said synchronizing signal having in each period thereof a measuring edge;

means for generating measurements of phase differences between said measuring edges of said synchronizing signal and an input signal having said second frequency; and, low pass filtering means for generating period correction values related to said phase measurements for controlling said resetting means.

38. The circuit of claim 37, wherein said synchronizing signal also has in each period thereof a control edge for controlling said means for generating phase measurements.

39. The circuit of claim 37, wherein said synchronizing signal also has in each period thereof a control edge used for resetting said means for generating phase measurements.

40. The circuit of claim 39, wherein said measuring and control edges correspond to the ends of respective ones of said time intervals.

41. The circuit of claim 37, wherein said first frequency is an integer multiple of said second frequency.

42. The circuit of claim 37, wherein said second frequency is a horizontal scanning frequency.

43. The circuit of claim 37, wherein every other one of said successive time intervals is controlled in duration by said period correction values and the other ones of said time intervals are of fixed duration.

* * * * *